United States Patent
Rhyee et al.

(10) Patent No.: US 9,093,597 B2
(45) Date of Patent: Jul. 28, 2015

(54) THERMOELECTRIC MATERIAL, AND THERMOELECTRIC MODULE AND THERMOELECTRIC DEVICE COMPRISING THE THERMOELECTRIC MATERIAL

(75) Inventors: Jong-soo Rhyee, Suwon-si (KR); Sang-mock Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 589 days.

(21) Appl. No.: 13/218,832

(22) Filed: Aug. 26, 2011

(65) Prior Publication Data

US 2012/0055526 A1    Mar. 8, 2012

(30) Foreign Application Priority Data

Aug. 26, 2010  (KR) .................. 10-2010-0083068

(51) Int. Cl.
*H01L 35/16*  (2006.01)
(52) U.S. Cl.
CPC ..................................... *H01L 35/16* (2013.01)
(58) Field of Classification Search
CPC ... H01L 35/16; H01L 31/032; H01L 31/0328; H01L 21/02568
USPC .................. 136/200, 261, 262, 264
See application file for complete search history.

(56) References Cited

U.S. PATENT DOCUMENTS

| | | | | |
|---|---|---|---|---|
| 2,896,005 A | * | 7/1959 | Fritts et al. | 136/203 |
| 3,110,685 A | * | 11/1963 | Offergeld | 252/512 |
| 3,181,303 A | * | 5/1965 | Rabenau | 136/236.1 |
| 4,036,665 A | * | 7/1977 | Barr et al. | 136/202 |
| 4,497,973 A | * | 2/1985 | Heath et al. | 136/212 |
| 5,439,528 A | * | 8/1995 | Miller | 136/200 |

FOREIGN PATENT DOCUMENTS

| | | |
|---|---|---|
| JP | 2000-036627 A | 2/2000 |
| JP | 2000-277817 A | 10/2000 |
| JP | 2002-214142 A | 7/2002 |
| JP | 2002-344033 A | 11/2002 |
| JP | 2007-088239 A | 4/2007 |
| KR | 1020080069995 A | 7/2008 |
| KR | 1020090029045 A | 3/2009 |
| KR | 1020090106320 A | 10/2009 |
| KR | 1020090116652 A | 11/2009 |
| KR | 102010009455 A | 1/2010 |
| KR | 1020100009521 A | 1/2010 |
| KR | 1020100038961 A | 4/2010 |
| WO | 02/48701 A2 | 6/2002 |

(Continued)

OTHER PUBLICATIONS

Lenntech Iodine Information (Evidentiary reference).*
Lenntech Tellurium Information (Evidentiary reference).*

(Continued)

*Primary Examiner* — Jennifer Michener
*Assistant Examiner* — Sadie White
(74) *Attorney, Agent, or Firm* — Cantor Colburn LLP

(57) ABSTRACT

A thermoelectric material having a high performance index and a thermoelectric module and a thermoelectric device including the thermoelectric material, and more particularly, to a thermoelectric material having a high Seebeck coefficient, high electrical conductivity, and low thermal conductivity and a thermoelectric module and a thermoelectric device including the thermoelectric material.

16 Claims, 16 Drawing Sheets

(56) References Cited

FOREIGN PATENT DOCUMENTS

WO      2006/058263 A2      6/2006
WO   WO 2010080279 A2 *    7/2010

OTHER PUBLICATIONS

Rhee, et al. Nature, vol. 459, Jun. 2009, pp. 965-968, and Supplemental Information.*
Rhee, et al., Advanced Materials, vol. 23, Apr. 2011, pp. 2191-2194.*
Micocci, et al., Solar Energy Materials and Solar Cells, 1992, vol. 28, pp. 223-232.*
Chevy (J. Appl. Phys. 1984, vol. 56, pp. 978-982).*
Rhyee et al., "Peierls distortion as a route to high thermoelectric performance in In4Se3-d crystals", Nature, vol. 459, Jun. 18, 2009, pp. 965-968.

* cited by examiner

THERMOELECTRIC MATERIAL, AND THERMOELECTRIC MODULE AND THERMOELECTRIC DEVICE COMPRISING THE THERMOELECTRIC MATERIAL

CROSS-REFERENCE TO RELATED APPLICATIONS

This application claims priority to Korean Patent Application No. 10-2010-0083068, filed on Aug. 26, 2010, and all the benefits accuring therefrom under 35 U.S.C. §119, the contents of which in their entirety are herein incorporated by reference.

BACKGROUND

1. Field

The present disclosure relates to a thermoelectric material having a high performance index and a thermoelectric module and a thermoelectric device including the thermoelectric material, and more particularly, to a thermoelectric material having a high Seebeck coefficient, high electrical conductivity, and low thermal conductivity and a thermoelectric module and a thermoelectric device including the thermoelectric material.

2. Description of the Related Art

In general, thermoelectric materials are materials that are used in active cooling, waste heat power generation, and other similar applications of the Peltier effect and the Seebeck effect. FIG. 1 schematically shows thermoelectric cooling using the Peltier effect. Referring to FIG. 1, the Peltier effect is a phenomenon in which, when a DC voltage is externally applied, holes of a p-type material and electrons of an n-type material are transported to cause heat generation and heat absorption at opposite ends of both the n-type and p-type materials. FIG. 2 schematically shows thermoelectric power generation using the Seebeck effect. Referring to FIG. 2, the Seebeck effect is a phenomenon in which, when heat is supplied from an external heat source, current-flow is generated in the material while electrons and holes are transported to cause power generation.

Active cooling that uses such a thermoelectric material improves thermal stability of devices, does not cause vibration and noise, and does not use a separate condenser and refrigerant, and thus the volume of devices is small and the active cooling method is environmentally-friendly. Thus, active cooling that uses a thermoelectric material may be applied to refrigerant-free refrigerators, air conditioners, a variety of micro-cooling systems, and the like. In particular, when a thermoelectric device is attached to memory devices or other computer devices, the volume of the memory devices may be decreased and the temperature of the devices may also be maintained to be uniform and stable, especially in comparison with a conventional cooling method. Thus, the memory device or other computer device may have improved performance.

Meanwhile, when thermoelectric materials are used in thermoelectric power generation by using the Seebeck effect, the waste heat extracted by the thermoelectric materials may be used as an energy source. Thus, thermoelectric materials may be applied in a variety of fields that increase energy efficiency or reuse waste heat, such as in vehicle engines and air exhausters, waste incinerators, waste heat in iron mills, power sources of medical devices in the human body using human body heat, and other applications.

A dimensionless performance index ZT, defined as shown in Equation 1 below, is used to show the performance efficiency of a thermoelectric material.

$$ZT = \frac{S^2 \sigma T}{k} \quad \text{Equation 1}$$

where S is a Seebeck coefficient, $\sigma$ is an electrical conductivity, T is an absolute temperature, and $\kappa$ is a thermal conductivity of a thermoelectric material.

To increase values of the dimensionless performance index ZT, there is a need to develop a material having a high Seebeck coefficient, high electrical conductivity, and low thermal conductivity.

SUMMARY

One or more exemplary embodiments include a thermoelectric material having a high Seebeck coefficient, high electrical conductivity, and low thermal conductivity.

One or more exemplary embodiments include a thermoelectric module including a thermoelectric element that includes the thermoelectric material.

One or more exemplary embodiments include a thermoelectric device including the thermoelectric module.

Additional aspects will be set forth in part in the description which follows and, in part, will be apparent from the description, or may be learned by practice of the presented embodiments.

One or more exemplary embodiments may include a thermoelectric material represented by the following formula;

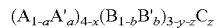

$(A_{1-a}A'_a)_{4-x}(B_{1-b}B'_b)_{3-y-z}C_z$ wherein A is a Group XIII element, and A' includes at least one selected from the group consisting of a Group XIII element, a Group XIV element, a rare earth metal, a transition metal, and combinations thereof wherein A and A' are different from each other, and wherein B include at least one chalcogen element, and B' includes at least one selected from the group consisting of elements of Groups XIV, XV, XVI and combinations thereof, wherein B and B' are different from each other, wherein C includes at least one halogen element, wherein a is equal to or larger than 0 and less than 1, wherein b is equal to or larger than 0 and less than 1, wherein x is between −1 and 1, wherein y is between −1 and 1, and wherein z is between 0 and 0.5.

In one exemplary embodiment of a thermoelectric material, the thermoelectric material may have a two-dimensional layered structure.

In one exemplary embodiment of a thermoelectric material, the thermoelectric material may have an one-dimensional or two-dimensional lattice distortion in an in-plane direction and a disordered layered structure in an a-axis direction that is perpendicular to the in-plain direction.

In one exemplary embodiment of a thermoelectric material, a covalent bond may be formed in an in-plane direction, and an ionic bond and/or Van der Waals bond may be formed between layers.

In one exemplary embodiment of a thermoelectric material, the thermoelectric material may have a thermal conductivity of about 2 W/mK or less at room temperature.

In one exemplary embodiment of a thermoelectric material, the thermoelectric material may have a degree of crystallinity that is a rate of a crystal domain having the same crystal face in the range of about 10% to about 100%.

In one exemplary embodiment of a thermoelectric material, A may be at least one of gallium (Ga) and indium (In).

In one exemplary embodiment of a thermoelectric material, B may be at least one of sulfur (S), selenium (Se) and tellurium (Te).

In one exemplary embodiment of a thermoelectric material, a may be equal to or larger than 0 and equal to or less than 0.5.

In one exemplary embodiment of a thermoelectric material, b may be equal to or larger than 0 and equal to or less than 0.5.

In one exemplary embodiment of a thermoelectric material, x may be equal to or larger than 0 and equal to or less than 0.5.

In one exemplary embodiment of a thermoelectric material, y may be equal to or larger than 0 and equal to or less than 0.5.

In one exemplary embodiment of a thermoelectric material, z may be larger than 0 and less than 0.1.

One or more exemplary embodiments may include thermoelectric module. One such exemplary embodiment of a thermoelectric module includes; a first electrode, a second electrode, and a thermoelectric element interposed between the first electrode and the second electrode, wherein the thermoelectric element includes the thermoelectric material.

One or more exemplary embodiments may include thermoelectric device. One such exemplary embodiment of the thermoelectric device includes the thermoelectric module and a heat source.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
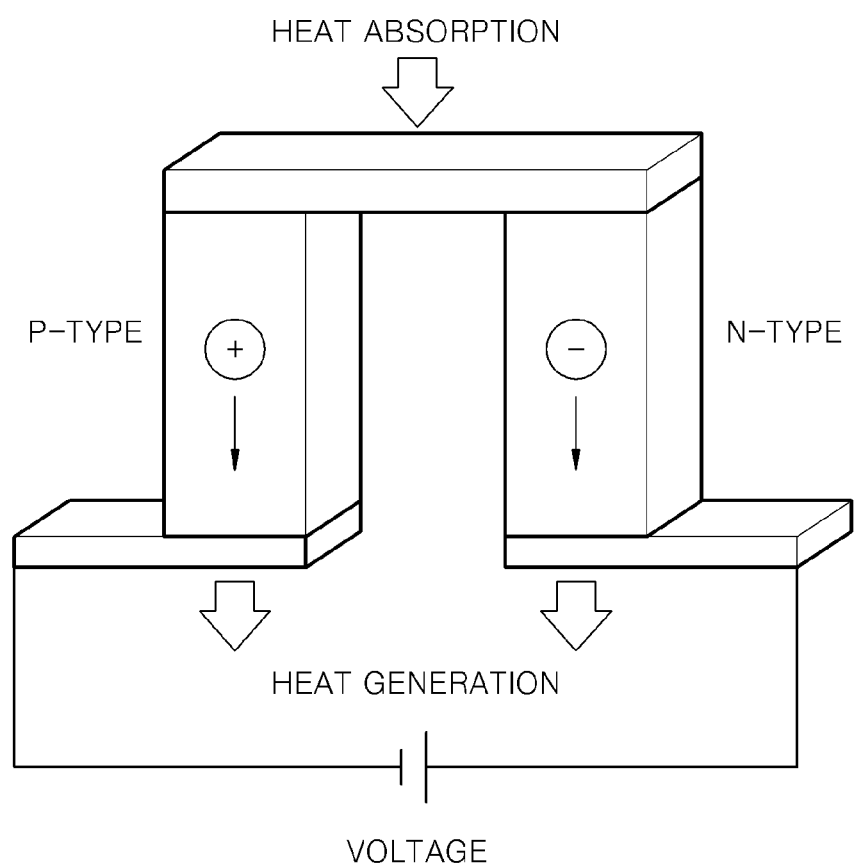
FIG. 1 is a schematic diagram illustrating thermoelectric cooling using the Peltier effect.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

In order to increase a dimensionless performance index ZT that is a factor determining performance of a thermoelectric material, a material having a high Seebeck coefficient, high electrical conductivity, and low thermal conductivity may be generally used. Thermal conductivity κ is divided into thermal conductivity due to electrons $k_{el}$ and thermal conductivity due to quantized lattice vibration, i.e., phonons $k_{ph}$, e.g., $k_{tot}=k_{el}+k_{ph}$. The electron thermal conductivity $k_{el}$ is proportional to electrical conductivity σ and absolute temperature T according to the Wiedemann-Frantz's law as shown in Mathematical Formula 2 below. Thus, the electron thermal conductivity $k_{el}$ is a dependent variable of the electrical conductivity σ. Thus, in order to independently reduce thermal conductivity $k_{tot}$, thermal conductivity $κ_{ph}$ by phonons may be reduced $K_{el}=LT\sigma$ (wherein $L=2.44\times10^{-8}$ $\Omega W/K^2$) <Mathematical Formula 2>

Figure 3:
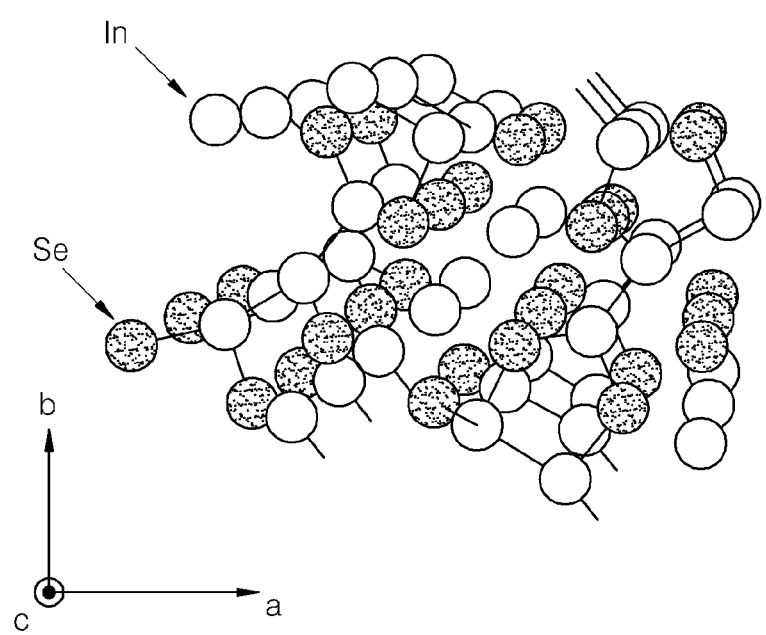
FIG. 3 shows a crystal structure of an exemplary embodiment of $In_4Se_3$.

FIG. 3 shows a crystal structure of an AB-based material having a layered structure, for example, in one exemplary embodiment $In_4Se_3$. Referring to FIG. 3, $In_4Se_3$ has a two-dimensional layered structure in which In—Se clusters form covalent bonds in a bc-plane, and interstitial In is disposed between In—Se layers which form Van der Waals bonds in an a-direction. Thus, relatively strong Van der Waals bonds may be formed. Due to such structural characteristics, mechanical strength of a material having a weak Van der Waals bond may be increased. Due to anisotropy of a binding force of the crystals, thermal conductivity may be reduced. The thermal conductivity may be reduced not only by the Van der Waals bond formed in the a-axis direction, but also by Peierls lattice distortion in an in-plane direction. Thus, as crystallinity of a sample is improved, the effect of the lattice distortion increases, and thereby reducing thermal conductivity.

In one exemplary embodiment, crystallinity may be improved by incorporating a halogen element on an AB-based thermoelectric material. Thus, in one exemplary embodiment, a thermoelectric material having low thermal conductivity and a high power factor may be prepared.

An exemplary embodiment of the thermoelectric material may have high electrical conductivity and high crystallinity by incorporating a halogen element on the compound having the two-dimensional structure in which rigid bonds are formed in the in-plane direction by covalent bonds and weak bonds are formed in the a-axis direction by ionic bonds or Van der Waals bonds.

In one exemplary embodiment, as the crystallinity may be improved by the incorporating of the halogen element, the electro-negativity material may have a degree of crystallinity that is a rate of a crystal domain having the same crystal face in the range of about 10% to about 100%. The crystal domain having the same crystal face indicates a crystal domain having a same value in all directions except one direction in a crystal structure, as, for example, in one exemplary embodiment (320), (520), and (720) of the results of the X-ray diffraction pattern. As the number of the crystal domain having the same crystal face increases, crystallinity may be improved. An exemplary embodiment of the thermoelectric material may have a degree of crystallinity in the range of about 10% to about 100%, for example, in one exemplary embodiment about 20% or about 95%.

Accordingly, the thermoelectric material has an one-dimensional or two-dimensional lattice distortion in the in-plane direction and a disordered layered structure in the a-axis direction that is perpendicular to the in-plane direction.

An exemplary embodiment of a compound efficiently used as a thermoelectric material is represented by Chemical Formula 1 below:

$(A_{1-a}A'_a)_{4-x}(B_{1-b}B'_b)_{3-y-z}C_z$                   <Chemical Formula 1> wherein A is a Group XIII element, and A' includes at least one selected from the group consisting of a Group XIII element, a Group XIV element, a rare earth metal, a transition metal and combinations thereof, wherein A and A' are different from each other, B include at least one chalcogen element, and B' includes at least one selected from the group consisting of elements of Groups XIV, XV, XVI combinations thereof, wherein B and B' are different from each other, C includes at least one halogen element, and wherein the following inequalities apply: $0 \leq a < 1$, $0 \leq b < 1$, $-1 < x < 1$, $-1 < y < 1$, and $0 < z < 0.5$.

In an exemplary embodiment of the compound of Chemical Formula 1, a B-defect site may be incorporated with a halogen element to increase current density and a crystallographic orientation of the AB-based crystals is improved so that thermal conductivity may be reduced and electrical conductivity may be increased due to lattice distortion, thereby increasing a power factor. In an exemplary embodiment, even though electrical conductivity is very low at around room temperature, the Seebeck coefficient does not significantly change. Thus, temperature dependency of the power factor is reduced so that the ZT value is increased at a low temperature range, for example, at room temperature. Therefore, thermoelectric performance is improved at a wide temperature range.

In Chemical Formula 1 above, components A and B, which act as the base components, may form a layered structure. Exemplary embodiments include configurations wherein component A may includes at least one Group XIII element, and component B includes at least one chalcogen element (Group XVI element). In one exemplary embodiment, components A' and B' are elements doped on the components A and B, respectively.

In one exemplary embodiment, the Group XIII element contained in the component A may be Ga and/or In. In one exemplary embodiment, In Chemical Formula 1 above, component A', which is doped on the component A as a substituent and selectively added to the base components to optimize current density of the thermoelectric material may include at least one selected from the group consisting of a Group XIII element, a Group XIV element, a rare earth element, and a transition metal, wherein the components A and A' are different from each other. Exemplary embodiments of the Group XIII element contained in A' may be Ga and/or In. Exemplary embodiments of the Group XIV element may be Si, Ge, Sn, or Pb. Exemplary embodiments include configurations wherein the rare earth element may be a lanthanide element.

In Chemical Formula 1 above, a molar ratio of A' (a) may be about $0 \leq a < 1$, for example, in one exemplary embodiment $0 \leq a \leq 0.5$ or $0 \leq a \leq 0.2$.

In Chemical Formula 1 above, a molar ratio of A and A' may be about $4-x$, wherein a value of x may be about $-1 < x < 1$, for example, in one exemplary embodiment $0 \leq x \leq 0.5$ or $0 \leq x \leq 0.2$.

In Chemical Formula 1 above, the chalcogen element contained in the component B, which acts asa base component of the thermoelectric material, may include at least one selected from the group consisting of S, Se, and Te.

In Chemical Formula 1 above, component B', which is doped on B as a substituent and selectively added to the base components to optimize current density of the thermoelectric material, may include at least one selected from the group consisting of a Group XIV element, a Group XV element, and a Group XVI element, wherein the components B and B' are different from each other. In one exemplary embodiment of the component B', the Group XIV element may be at least one of Si, Ge, Sn, and Pb, the Group XV element may be at least one of P, Sb, and Bi, and the Group XVI element may be at least one of S, Se, and Te.

Exemplary embodiments of the molar ratio of B' (b) may be about $0 \leq b < 1$, for example, in one exemplary embodiment $0 \leq b \leq 0.5$ or $0 \leq b \leq 0.2$.

In Chemical Formula 1 above, the molar ratio of B and B' may be $3-y-z$, wherein z is a incorporating molar ratio of a halogen element, and the value of y may be about $-1 < y < 1$, for example, in one exemplary embodiment $0 \leq y \leq 0.5$ or $0 \leq y \leq 0.2$.

Exemplary embodiments also include configurations wherein x and y are non-zero.

In Chemical Formula 1 above, the doping components A' and B' may be added in the form of one component, two components, three components or more components; in one exemplary embodiment A' may be up to three individual materials, e.g., a compound or mixture including a Group XIV element, a rare earth element and a transition metal. In the exemplary embodiment wherein the doping components A' and B' are added in the form of two components, a molar ratio thereof may be in the range of about 1:9 to about 9:1. In the exemplary embodiment wherein the doping components A' and B' are added in the form of three components, a molar ratio thereof may be in the range of about 1:0.1-0.9:0.1-0.9. However, the molar ratios are not limited thereto.

Exemplary embodiments of the molar ratios of (A+A'):(B+B') may be about 4:2.5-2.9, respectively.

In Chemical Formula 1 above, component C may be at least one halogen element incorporated on the AB-based material. In one exemplary embodiment, the component C may be selected from the group consisting of F, Cl, Br, and I. In one exemplary embodiment, the amount of C may be greater than defects of B and B'. In one exemplary embodiment, a molar ratio of C (z) may be about $0 < z < 0.5$, for example, in one exemplary embodiment $0 < z < 0.2$, $0 < z \leq 0.1$, or $0 < z \leq 0.05$.

In one exemplary embodiment, the thermoelectric material may include configurations wherein at least one of a and b is greater than 0 and wherein at least one of x and y is not equal to 0. Exemplary embodiments also include configurations wherein x is equal to 0.

In the exemplary embodiment of the thermoelectric material above, a B-defect site may be incorporated with a halogen element to increase current density and a crystallographic orientation of the AB-based crystals is improved so that thermal conductivity may be reduced and electrical conductivity may be increased due to lattice distortion, thereby increasing a power factor. Therefore, a thermoelectric material having a high thermoelectric performance index ZT, for example, high thermoelectric performance at room temperature, may be obtained. In the exemplary embodiment, the room temperature may be about 600K or less, for example about 550K or less, or about 400K or less. For example, in one exemplary embodiment the room temperature may be in the range of about 200K to about 400K, for example, about 250K to about 350K.

In the exemplary embodiment of the thermoelectric material including the compound represented by Chemical Formula 1 above may have a thermal conductivity of about 2 W/mK or less, for example, in the exemplary embodiment about 0.8 W/mK to about 2 W/mK at room temperature, for example, in the exemplary embodiment at about 300K.

In the exemplary embodiment, the thermoelectric material including the compound represented by Chemical Formula 1 above may also have an absolute value of Seebeck coefficient of about 50 µV/K or greater, for example, in the exemplary embodiment about 100 µV/K or greater, about 150 µV/K or greater, or about 200 µV/K or greater at room temperature, for example, in the exemplary embodiment at about 300K.

In the exemplary embodiment, the thermoelectric material including the compound represented by Chemical Formula 1 above may also have a power factor ($S^2\sigma$) of about 0.05 mW/(mK$^2$) or greater, for example, in the exemplary embodiment, about 0.1 mW/(mK$^2$) or greater, about 0.2 mW/(mK$^2$) or greater, or about 0.6 mW/(mK$^2$) or greater at room temperature, for example, in the exemplary embodiment, at about 300K.

In the exemplary embodiment, the thermoelectric material including the compound represented by Chemical Formula 1 above may also have a performance index ZT of about 0.01 or greater, for example, in the exemplary embodiment about 0.05 or greater, about 0.1 or greater, or about 0.3 mW/(mK$^2$) or greater at room temperature, for example, in the exemplary embodiment, at about 300K.

In the exemplary embodiment, the thermoelectric material may have a polycrystal or single crystal structure.

Exemplary embodiments of a method of synthesizing the compound of Chemical Formula 1 may be classified into polycrystalline synthesis and single crystal growth.

1. Polycrystalline Synthesis (1) One exemplary embodiment of a polycrystalline synthesis includes a method using an ampoule. An exemplary embodiment of such a method includes adding a material element to an ampoule made of a quartz tube or metal, sealing the ampoule in a vacuum, and heat treating the ampoule.

(2) Another exemplary embodiment of a polycrystalline synthesis includes an arc melting method. An exemplary embodiment of such a method includes adding a material element to a chamber, discharging an arc in an inert gas atmosphere to dissolve the material element, and preparing a sample.

(3) Another exemplary embodiment of a polycrystalline synthesis includes a solid state reaction method. An exemplary embodiment of such a method includes mixing a powder to process the power solidly and then heat treating the resultant, or heat treating a mixed powder and then processing and sintering the resultant.

2. Single Crystal Growth (1) Another exemplary embodiment of a single crystal growth synthesis includes a metal flux method. An exemplary embodiment of such a method includes adding a material element and an element that provides a gas atmosphere to a furnace so that the material element can grow satisfactorily into a crystal at a high temperature, and heat treating the resultant at a high temperature to grow a crystal.

(2) Another exemplary embodiment of a single crystal growth synthesis includes a Bridgeman method. An exemplary embodiment of such a method includes adding a material element to a furnace, heating the material element at an end portion of the furnace at a high temperature until the material element is dissolved, locally dissolving the material element while a region to be heated is slowly moved so as to pass the whole material element through the heated regions, and as a result, growing a crystal.

(3) Another exemplary embodiment of a single crystal growth synthesis includes an optical floating zone method. An exemplary embodiment of such a method includes preparing a material element in the form of a seed rod and a feed rod, converging light of a lamp on the feed rod to locally dissolve the material element at a high temperature, and then slowly moving a region to be irradiated to dissolve the material element to grow a crystal.

(4) Another exemplary embodiment of a single crystal growth synthesis includes a vapor transport method. An exemplary embodiment of such a method includes putting a material element into a bottom portion of a quartz tube, heating the bottom portion containing the material element, and maintaining a top portion of the quartz tube at a low temperature to induce a solid state reaction at a low temperature while the material element is evaporated, thereby growing a crystal.

Exemplary embodiments of the thermoelectric material may be prepared using any one of the various methods described above without limitation.

If two-band conduction where electrons and holes co-exist occurs by optimizing current density by selectively doping elements in the method of preparing the compound of Chemical Formula 1, a thermoelectric material having a large power factor and very low thermal conductivity may be prepared since either of the electrons or holes have conductivity.

When doped with an element, the thermoelectric material includes A' and/or B' as a doping element, and accordingly, has an optimized current density, resulting in increased electrical conductivity. That is, if an A site is substituted with the doping element A' or a B site is substituted with the doping element B', the current density of either of the holes or electrons is increased. As a result, a compensation effect of electrons and holes may be prevented, and thus conductivity in the a-axis may be improved. Due to the improved conductivity, the power factor $S^2\sigma$ is increased, thereby increasing the Seebeck coefficient.

In one exemplary embodiment, the doping process may be performed by adding the doping component as a part of the material element in the polycrystalline synthesis or single crystal growth.

Meanwhile, in one exemplary embodiment, a high densification process may further be conducted in addition to the doping process in the compound having the polycrystal structure. Due to the high densification process, electrical conductivity may further be improved.

Exemplary embodiments of the high densification process may be classified into the following three groups.

(1) One exemplary embodiment of the high densification process includes a hot press method. In one exemplary embodiment, the hot press method includes adding a powered compound to a mold, and molding the compound at a high temperature, for example, at about 300° C. to about 800° C., at a high pressure, for example, at about 30 MPa to about 300 MPa.

(2) Another exemplary embodiment of the high densification process includes spark plasma sintering. In one exemplary embodiment, the spark plasma sintering method includes passing a high-voltage current, for example, about 50 Amps to about 500 Amps, through a powdered compound to sinter the material in a short period of time.

(3) Another exemplary embodiment of the high densification process includes hot forging. In one exemplary embodiment, the hot forging method includes extrusion molding and processing a powdered compound at a high temperature, for example, at about 300° C. to about 700° C.

Due to the high densification process, the thermoelectric material has a density which is about 70% to about 100% of the theoretical density. In one exemplary embodiment, the thermoelectric material has a density which is about 95% to about 100% of the theoretical density. Thus, electric conductivity is increased.

According to another exemplary embodiment, an exemplary embodiment of a thermoelectric element may be prepared by cutting and processing the thermoelectric material. If the thermoelectric material has a single crystal structure, a cleavage direction of the thermoelectric material may be perpendicular to a growth direction thereof.

Exemplary embodiments of the thermoelectric element may be a p-type or an n-type thermoelectric element. The thermoelectric material may be processed, for example in one exemplary embodiment, in a rectangular parallelepiped shape to form the thermoelectric element.

Figure 2:
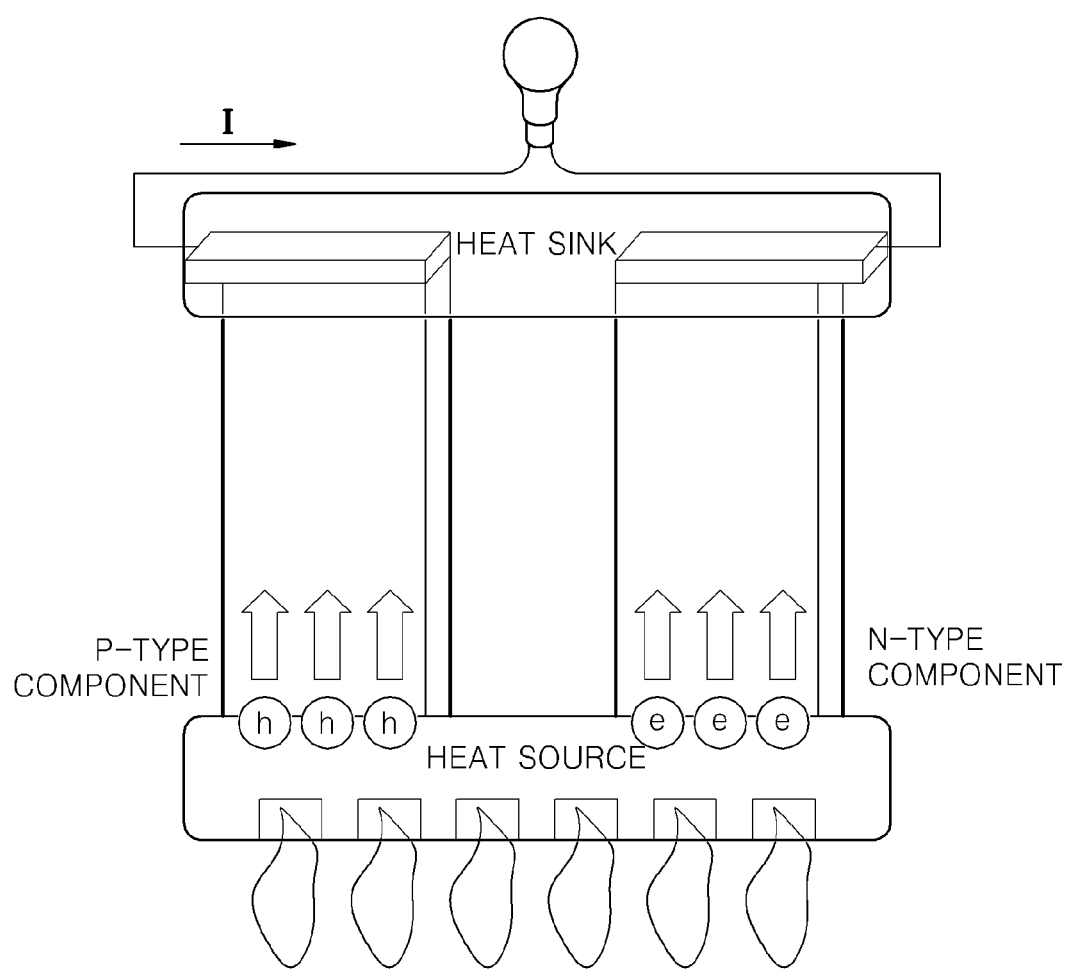
FIG. 2 is a schematic diagram illustrating thermoelectric power generation using the Seebeck effect.
Figure 4:
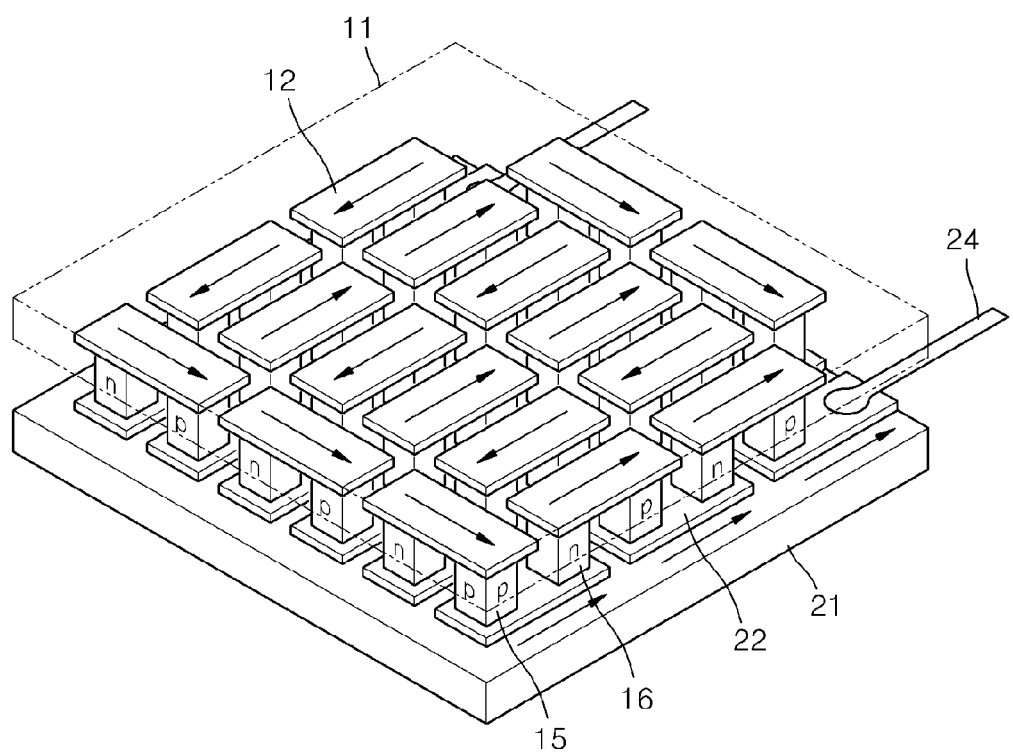
FIG. 4 is a thermoelectric module according to an embodiment of the present invention.

Meanwhile, a thermoelectric device may be a device having cooling effects by using a current supply as shown in FIG. 1 or a device having power generation effects using a temperature difference as shown in FIG. 2. FIG. 4 illustrates an exemplary embodiment of a thermoelectric module using the exemplary embodiment of a thermoelectric element. As shown in FIG. 4, an upper electrode 12 and a lower electrode 22 are respectively patterned on an upper insulating substrate 11 (shown in a dotted-line for ease of viewing) and a lower insulating substrate 21. A p-type thermoelectric element 15 and an n-type thermoelectric element 16 are in contact with the upper electrode 12 and the lower electrode 22. The upper and lower electrodes 12 and 22 are connected to the exterior of the device via a lead electrode 24.

Exemplary embodiments also include thermoelectric devices. One such exemplary embodiment of a thermoelectric device includes; a first electrode, a second electrode, and a thermoelectric material disposed between the first electrode and the second electrode and represented by Chemical formula 1, similar to the configuration illustrated in FIG. 1. In one exemplary embodiment, a thermoelectric device further includes an insulating substrate on which one of the first electrode and the second electrode is disposed, similar to the configuration illustrated in FIG. 4. In one exemplary embodiment, one of the first electrode and the second electrode is configured to be exposed to a heat source similar to the configuration illustrated in FIG. 2.

In one exemplary embodiment of a thermoelectric device, one of the first electrode and the second electrode is coupled to a power source, similar to the configuration illustrated in FIG. 1. In one exemplary embodiment of a thermoelectric device, x is equal to 0. In one exemplary embodiment of a thermoelectric device, at least one of a and b is greater than 0. In one exemplary embodiment of a thermoelectric device, at least one of x and y is not equal to 0. In one exemplary embodiment of a thermoelectric device x is greater than 0 and less than 1. In one exemplary embodiment of a thermoelectric device y is greater than 0 and less than 1. In one exemplary embodiment of a thermoelectric device, A is at least one of In and Ga. In one exemplary embodiment of a thermoelectric device B is at least one of Se and Te.

In one exemplary embodiment of a thermoelectric device the thermoelectric material has a lattice distortion. In one exemplary embodiment of a thermoelectric device the thermoelectric material has one of a single crystalline structure and a polycrystalline structure. In one exemplary embodiment of a thermoelectric device the thermoelectric material has a single crystalline structure and is cut in a direction substantially perpendicular to a growth direction of the crystalline structure.

In one exemplary embodiment of a thermoelectric device a p-type thermoelectric material and a n-type thermoelectric material are alternately arranged, and at least one of the p-type thermoelectric material and the n-type thermoelectric material include the thermoelectric material of Chemical Formula 1, similar to the configuration illustrated in FIG. 4.

Exemplary embodiments also include an apparatus including; a heat source, and a thermoelectric device including; a first electrode which absorbs heat from the heat source, a second electrode disposed substantially opposite the first electrode, and a thermoelectric material represented by Chemical Formula 1. Exemplary embodiments of the apparatus include configurations further including a power source electrically connected to the second electrode. Exemplary embodiments of the apparatus include configurations further including an electric device electrically connected to the second electrode and which one of consumes and stores power.

Exemplary embodiments of the upper and lower insulating substrates 11 and 21 may include a GaAs, sapphire, silicon, Pyrex, or quartz substrate. Exemplary embodiments of the upper and lower electrodes 12 and 22 may be formed of Al, Ni, Au, Ti, or other similar materials. The size of the upper and lower electrodes 12 and 22 are not limited. The upper and lower electrodes 12 and 22 may be patterned using a known method, for example, in one exemplary embodiment a lift-off process for semiconductor fabrication, deposition, or photolithography, or a combination thereof, may be employed.

As described above, the thermoelectric module may be a thermoelectric cooling system and/or a thermoelectric power generation system. The thermoelectric cooling system may be a micro cooling system, a universal cooling device, an air conditioner, and/or a waste heat recovery system, but is not limited thereto. The configuration of the thermoelectric cooling system and a method of preparing the thermoelectric cooling system are well known in the art, and thus will not be described herein.

Hereinafter, one or more embodiments of the present invention will be described in more detail with reference to the following examples. However, these examples are not intended to limit the scope of the one or more embodiments of the present invention.

Comparative Example 1

In and Se, as ingredients, were quantified to meet a stoichiometric molar ratio of $In_4Se_{2.35}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.35}$.

Example 1

In, Se, and $InCl_3$, as ingredients, were quantified to meet a stoichiometric molar ratio of $In_4Se_{2.67}Cl_{0.03}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.67}Cl_{0.03}$.

Figure 5:
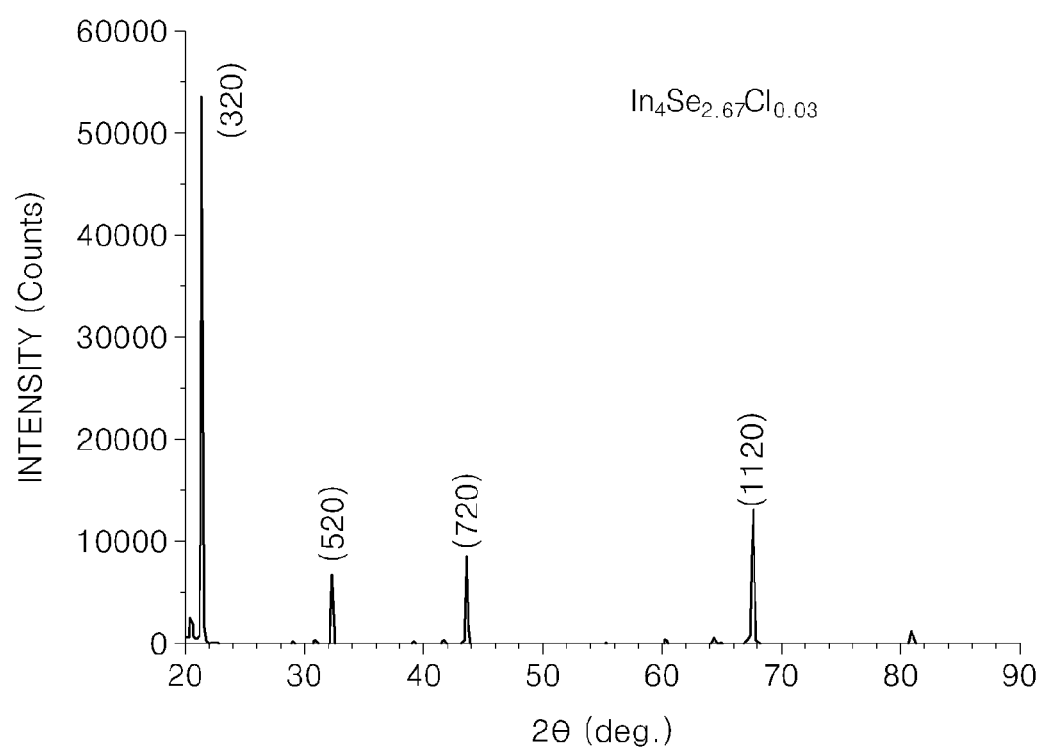
FIG. 5 is a graph illustrating an X-ray diffraction pattern of an exemplary embodiment of the formula $In_4Se_{2.67}Cl_{0.03}$ obtained according to Example 1.

FIG. 5 is a graph illustrating an X-ray diffraction pattern of $In_4Se_{2.67}Cl_{0.03}$ which indicates that the crystal face of a sample is uniformly aligned in the a-axis direction.

Example 2

In, Se, and $InF_3$, as ingredients, were quantified to meet a stoichiometric molar ratio of $In_4Se_{2.32}F_{0.03}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.32}F_{0.03}$.

Example 3

In, Se, and $InCl_3$, as ingredients, were quantified to meet a stoichiometric molar ratio of $In_4Se_{2.32}Cl_{0.03}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.32}Cl_{0.03}$.

Example 4

In, Se, and $InBr_3$, as ingredients, were quantified to meet a stoichiometric molar ratio of $In_4Se_{2.32}Br_{0.03}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.32}Br_{0.03}$.

Example 5

In, Se, and $InI_3$, as ingredients, were quantified to meet a stoichiometric molar ratio of $In_4Se_{2.32}I_{0.03}$ and were added to a quartz tube. The quartz tube was sealed in a vacuum using a hydrogen torch and heat treated at 500° C. for 24 hours. A melt ingot was pulverized to prepare a metal powder, and the metal powder was compressed at 3 tons in a cold press mold. The resultant was sintered at 520° C. for 24 hours. The resultant was further pulverized to obtain a metal powder to have uniformity and sufficient density. The metal powder was compressed at 70 MPa at a temperature of about 480 to about 500° C. for 1 hour to prepare $In_4Se_{2.32}I_{0.03}$.

Experimental Example 1

Measurement of Thermal Conductivity

Figure 6:
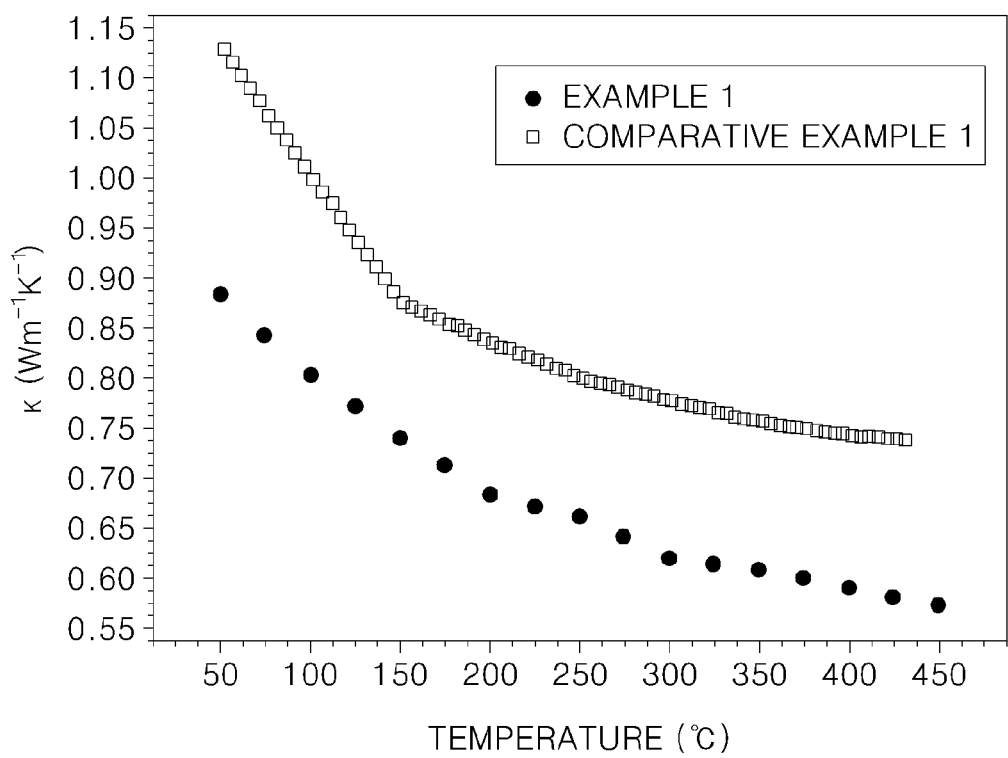
FIG. 6 is a graph illustrating thermal conductivity of an exemplary embodiment of thermoelectric materials obtained according to Comparative Example 1 and Example 1.

Thermal conductivity of $In_4Se_{2.35}$ and $In_4Se_{2.67}Cl_{0.03}$ prepared according to Comparative Example 1 and Example 1 was measured, and the results are shown in FIG. 6. Referring to FIG. 6, thermal conductivity of $In_4Se_{2.67}Cl_{0.03}$ prepared by incorporating Cl is far less than that of $In_4Se_{2.35}$.

Figure 7:
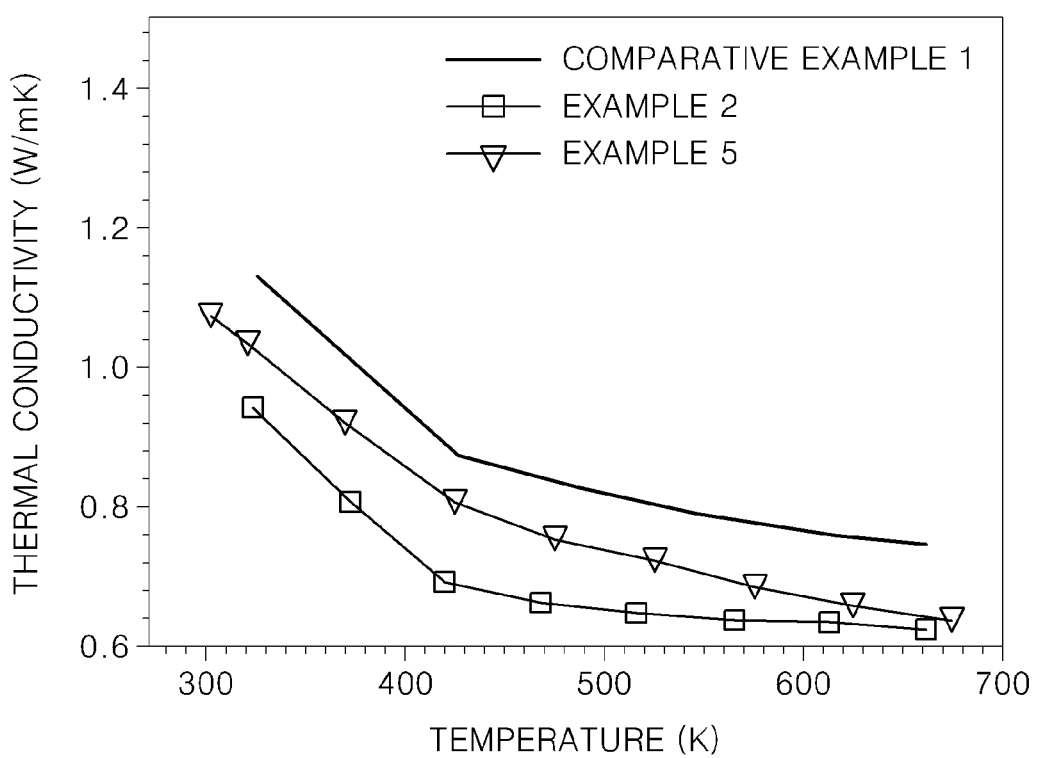
FIG. 7 is a graph illustrating thermal conductivity of an exemplary embodiment of thermoelectric materials obtained according to Comparative Example 1, Example 2 and Example 5.

Thermal conductivity of $In_4Se_{2.35}$, $In_4Se_{2.32}F_{0.03}$ and $In_4Se_{2.32}I_{0.03}$ prepared according to Comparative Example 1, Example 2 and Example 5 was measured, and the results are shown in FIG. 7. Referring to FIG. 7, thermal conductivity of $In_4Se_{2.32}F_{0.03}$ and $In_4Se_{2.32}I_{0.03}$ prepared by incorporating F or I is far less than that of $In_4Se_{2.35}$.

This is because lattice distortion is increased as crystallinity is improved.

Thermal conductivity was calculated by measuring thermal diffusivity using a laser flash method.

Experimental Example 2

Measurement of Electrical Resistance

Figure 8:
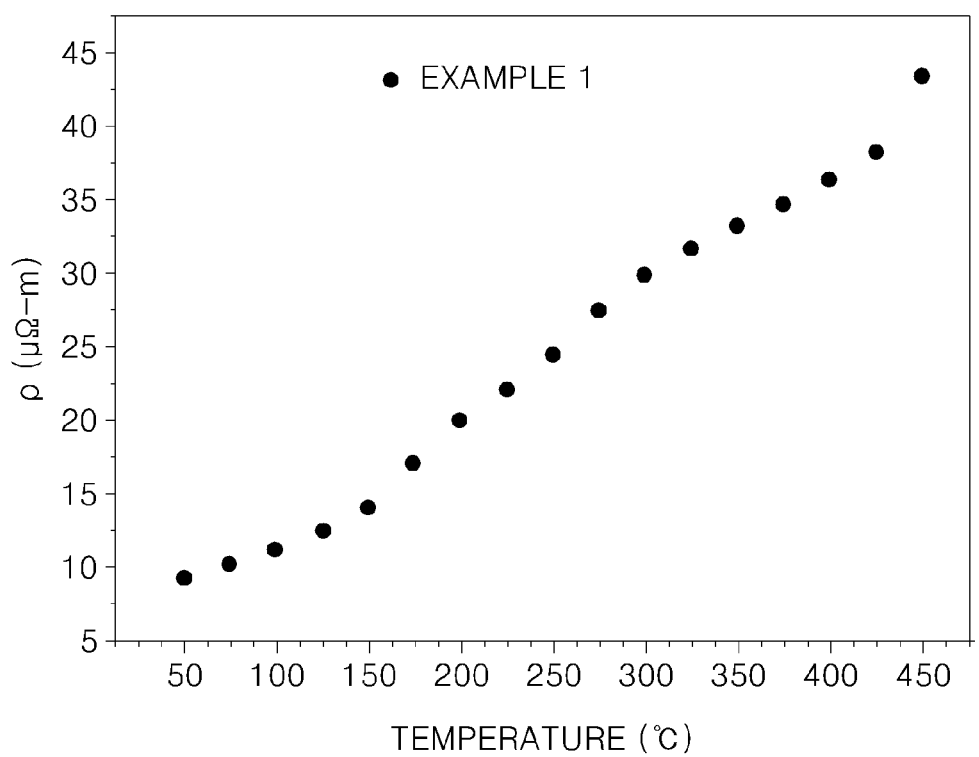
FIG. 8 is a graph illustrating electrical resistance of an exemplary embodiment of a thermoelectric material obtained according to Example 1.
Figure 9:
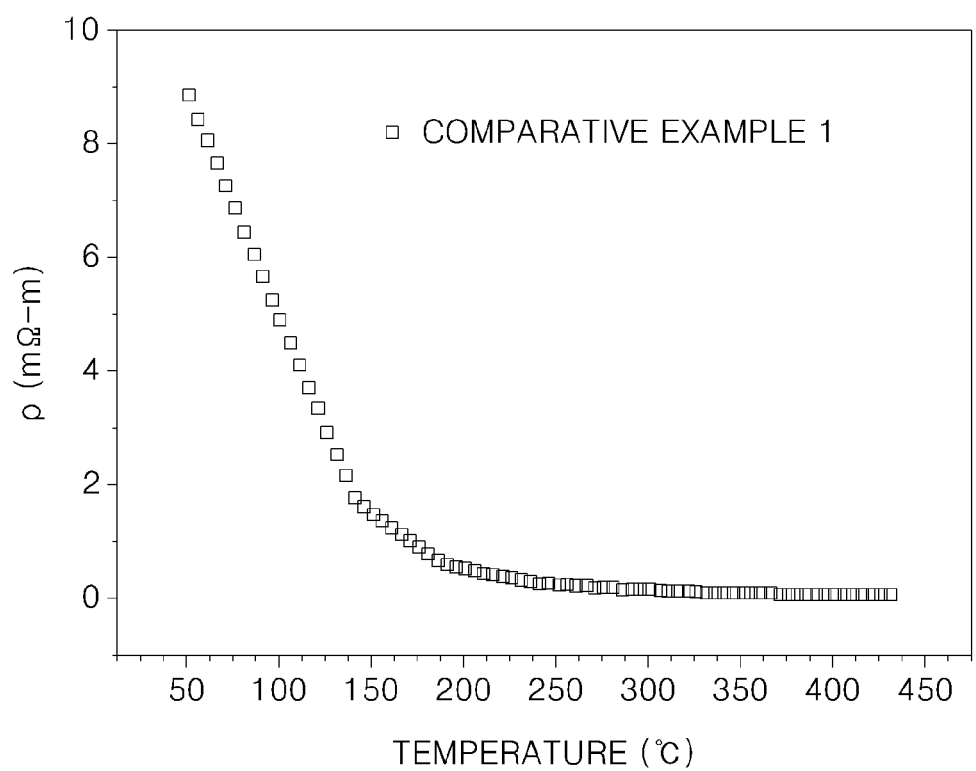
FIG. 9 is a graph illustrating electrical resistance of an exemplary embodiment of a thermoelectric material obtained according to Comparative Example 1.

Electrical resistance of $In_4Se_{2.35}$ and $In_4Se_{2.67}Cl_{0.03}$ prepared according to Comparative Example 1 and Example 1 was measured, and the results are shown in FIGS. 8 and 9. Referring to FIGS. 8 and 9, while $In_4Se_{2.35}$ has a relatively high electrical resistance of several mΩ-m, $In_4Se_{2.67}Cl_{0.03}$ has a 100 times less electrical resistance of several tens μΩ-m.

Figure 10:
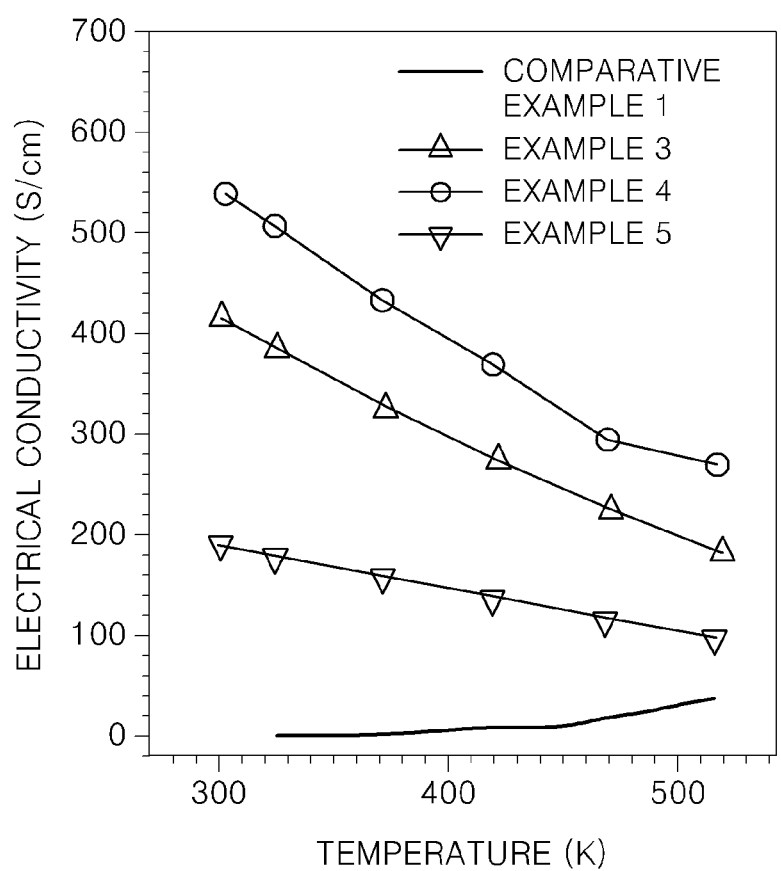
FIG. 10 is a graph illustrating electrical conductivity of an exemplary embodiment of a thermoelectric material obtained according to Comparative Example 1, Example 3, Example 4 and Example 5.

Electrical conductivity of $In_4Se_{2.35}$, $In_4Se_{2.32}Cl_{0.03}$, $In_4Se_{2.32}Br_{0.03}$, and $In_4Se_{2.32}I_{0.03}$ prepared according to Comparative Example 1, Example 3, Example 4 and Example 5 was measured, and the results are shown in FIG. 10. Referring to FIGS. 10, $In_4Se_{2.35}$ according to Comparative Example 1 has a relatively less electrical conductivity than $In_4Se_{2.32}Cl_{0.03}$, $In_4Se_{2.32}Br_{0.03}$, and $In_4Se_{2.32}I_{0.03}$ according to Example 3, Example 4 and Example 5.

Electrical resistance of a compound having a semiconductor gap such as $In_4Se_{2.35}$ is changed into that of a metal by incorporating a halogen element since current density is increased by electron incorporating with a halogen element. Even though electrical conductivity was significantly increased by the halogen incorporating, the total thermal conductivity was reduced by the halogen incorporating referring to FIG. 8-10. This indicates that lattice thermal conductivity is significantly reduced by the halogen incorporating.

The electrical resistance or conductivity was measured using a 4-terminal method.

Experimental Example 3

Measurement of Seebeck Coefficient

Figure 11:
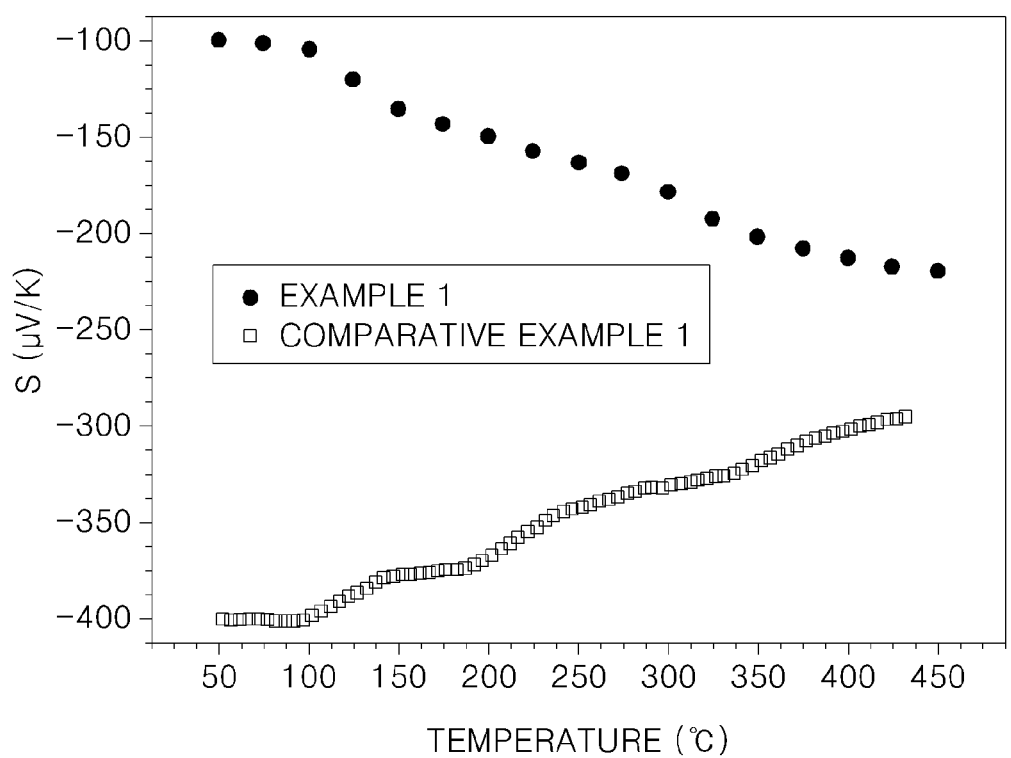
FIG. 11 is a graph illustrating Seebeck coefficients of an exemplary embodiment of thermoelectric materials obtained according to Comparative Example 1 and Example 1.

Seebeck coefficients of $In_4Se_{2.35}$ and $In_4Se_{2.67}Cl_{0.03}$ prepared according to Comparative Example 1 and Example 1 were measured, and the results are shown in FIG. 11. Referring to FIG. 11, the Seebeck coefficient of $In_4Se_{2.67}Cl_{0.03}$ was less than that of $In_4Se_{2.35}$ since electrical conductivity is significantly increased by the Cl incorporating.

Figure 12:
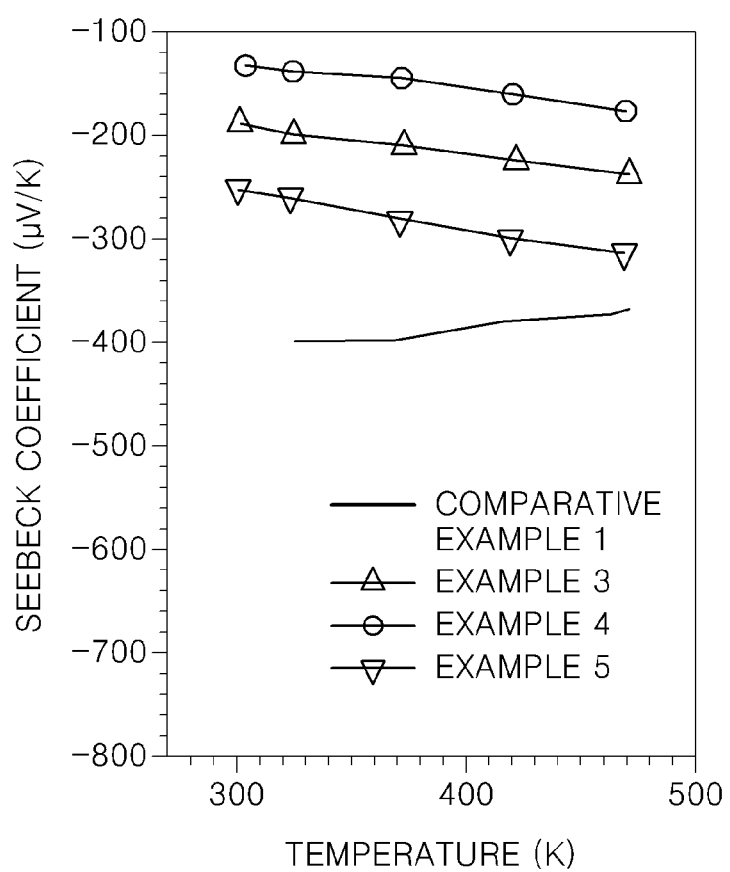
FIG. 12 is a graph illustrating Seebeck coefficients of an exemplary embodiment of thermoelectric materials obtained according to Comparative Example 1, Example 3, Example 4 and Example 5.

Seebeck coefficients of $In_4Se_{2.35}$, $In_4Se_{2.32}Cl_{0.03}$, $In_4Se_{2.32}Br_{0.03}$, and $In_4Se_{2.32}I_{0.03}$ prepared according to Comparative Example 1, Example 3, Example 4 and Example 5 was measured, and the results are shown in FIG. 12. Referring to FIG. 12, the Seebeck coefficient of $In_4Se_{2.35}$ according to Comparative Example 1 was less than $In_4Se_{2.32}Cl_{0.03}$, $In_4Se_{2.32}Br_{0.03}$, and $In_4Se_{2.32}I_{0.03}$ according to Example 3, Example 4 and Example 5, since electrical conductivity is significantly increased by the halogen incorporating.

The Seebeck coefficient was measured using a 4-terminal method.

Experimental Example 4

Calculation of Power Factor

Figure 13:
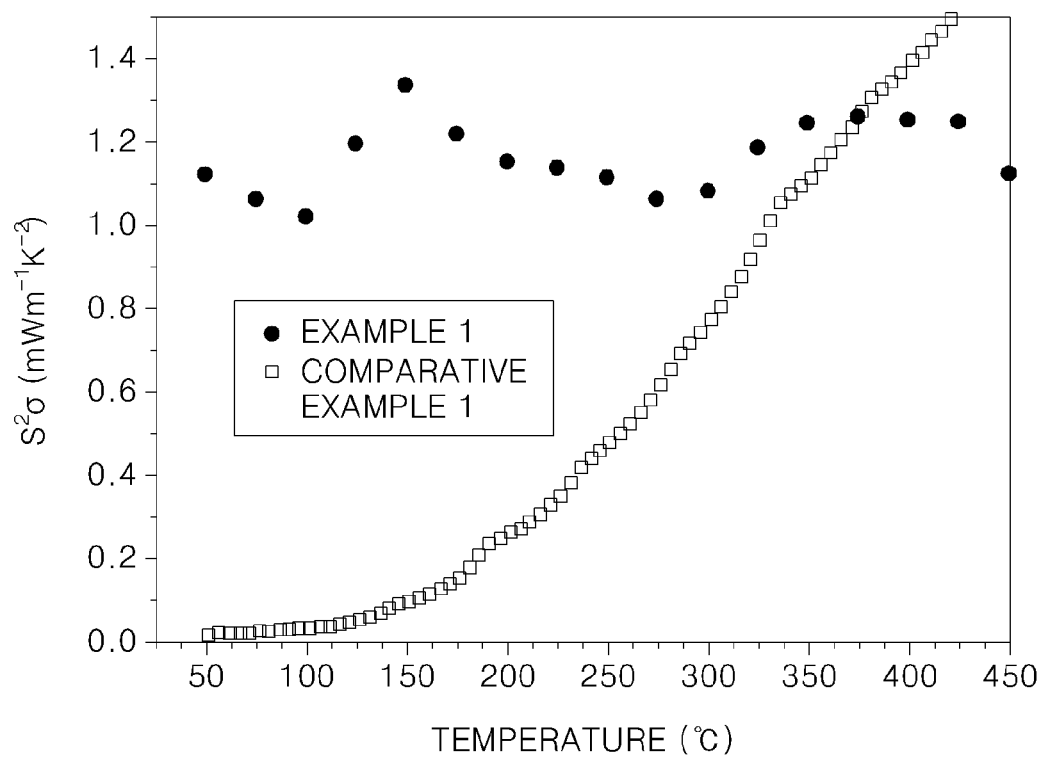
FIG. 13 is a graph illustrating power factors of an exemplary embodiment of thermoelectric materials obtained according to Comparative Example 1 and Example 1.

Power factors ($S_2\sigma$) were calculated using the electrical resistance and the Seebeck coefficient of Comparative Example 1 and Example 1 obtained in Experimental Examples 2 and 3, and the results are shown in FIG. 13.

Figure 14:
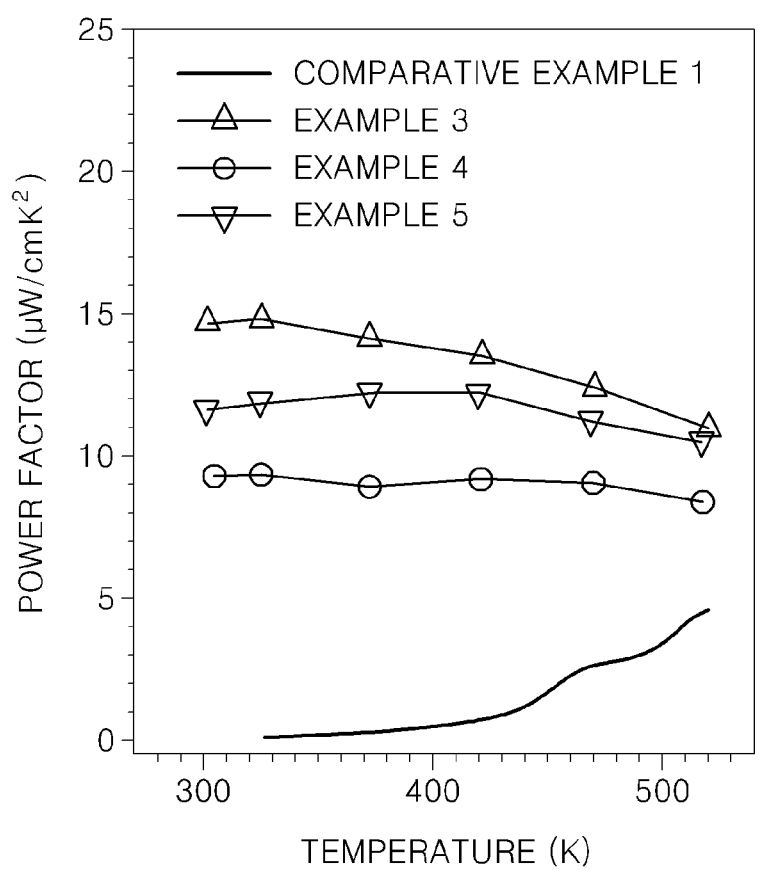
FIG. 14 is a graph illustrating power factors of an exemplary embodiment of thermoelectric materials obtained according to Comparative Example 1, Example 3, Example 4 and Example 5.

Power factors ($S_2\sigma$) were calculated using the electrical resistance and the Seebeck coefficient of Comparative Example 1 and Example 3-5 obtained in Experimental Examples 2 and 3, and the results are shown in FIG. 14.

Referring to FIGS. 13 and 14, $In_4Se_{2.67}Cl_{0.03}$, $In_4Se_{2.32}Cl_{0.03}$, $In_4Se_{2.32}Br_{0.03}$, and $In_4Se_{2.32}I_{0.03}$ have a high power factor in a very wide range of temperature due to the increased electrical conductivity ($\sigma$). A high power factor in a wide range of temperature widens a working temperature range of thermoelectric performance.

Experimental Example 5

Calculation of Performance Index ZT

Figure 15:
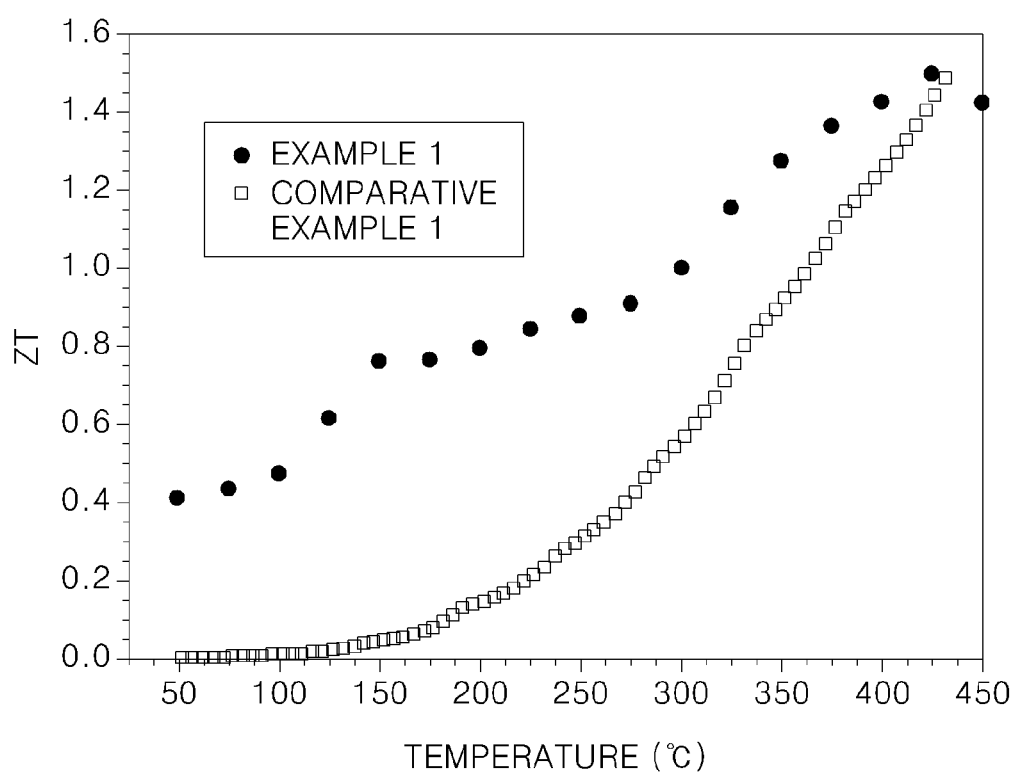
FIG. 15 is a graph illustrating performance indexes of an exemplary embodiment of thermoelectric materials obtained according to Comparative Example 1 and Example 1.

Performance indexes of $In_4Se_{2.35}$ and $In_4Se_{2.67}Cl_{0.03}$ prepared according to Comparative Example 1 and Example 1 were calculated using the result obtained in Experimental Examples 1 to 4, and the results are shown in FIG. 15.

Figure 16:
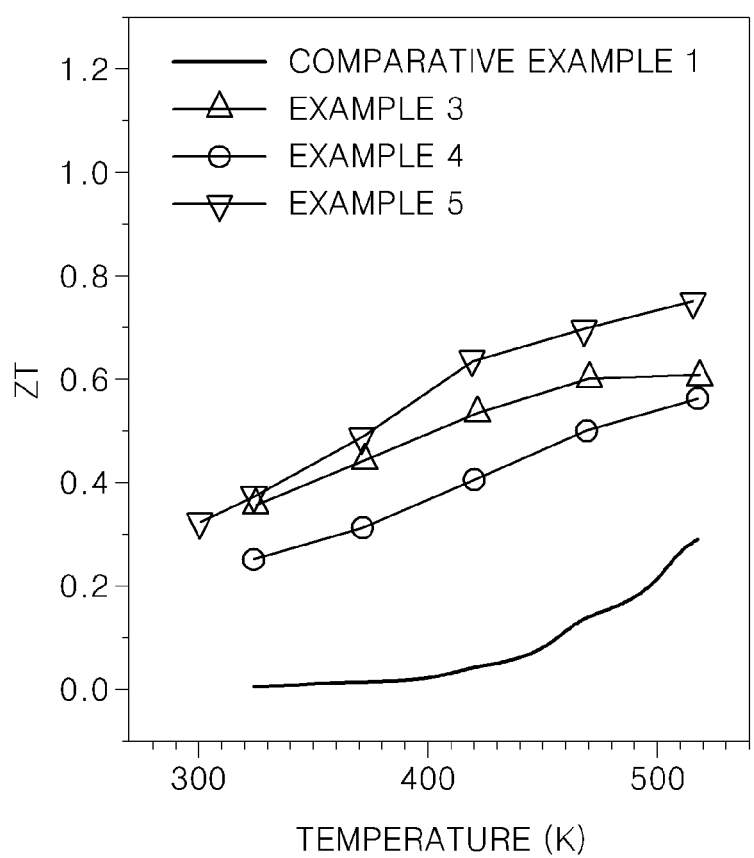
FIG. 16 is a graph illustrating performance indexes of an exemplary embodiment of thermoelectric materials obtained according to Comparative Example 1, Example 3, Example 4 and Example 5.

Performance indexes of $In_4Se_{2.35}$, $In_4Se_{2.32}Cl_{0.03}$, $In_4Se_{2.32}Br_{0.03}$, and $In_4Se_{2.32}I_{0.03}$ prepared according to Comparative Example 1, Example 3, Example 4 and Example 5 were calculated using the result obtained in Experimental Examples 1 to 4, and the results are shown in FIG. 16.

Since power factor obtained in Experimental Example 4 has a weak temperature dependency. Upon comparing ZT, while thermoelectric performance of $In_4Se_{2.35}$ is very low at low temperature and rapidly increases as temperature increases, a performance index ZT of $In_4Se_{2.67}Cl_{0.03}$, $In_4Se_{2.32}Cl_{0.03}$, $In_4Se_{2.32}Br_{0.03}$, and $In_4Se_{2.32}I_{0.03}$ is 0.2~0.4 at room temperature (300K).

As described above, according to the one or more of the above embodiments of the present invention, the thermoelectric material has high dimensionless performance index ZT due to a high Seebeck coefficient, high electrical conductivity, and low thermal conductivity. Therefore, the thermoelectric material may be efficiently applied to refrigerant-free refrigerators, air conditioners, waste heat power generation, nuclear power generation for military and aerospace, microcooling systems, and the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A thermoelectric material comprising a compound represented by the following formula:

$$In_{4-x}Se_{3-y-z}C_z$$

wherein C is at least one selected from halogen elements,
wherein x is between −1 and 1, wherein y is between −1 and 1,
wherein z is about 0.03, and
wherein the thermoelectric material has a thermal conductivity of about 1.1 W/mK or less at room temperature, and wherein the thermoelectric material has a one-dimensional or two-dimensional lattice distortion in an in-plane direction and a disordered layered structure in an a-axis direction that is perpendicular to the in-plane direction.

2. The thermoelectric material of claim 1, having a two-dimensional layered structure.

3. The thermoelectric material of claim 2, wherein a covalent bond is formed in an in-plane direction, and an ionic bond and/or Van der Waals bond is formed between layers.

4. The thermoelectric material of claim 1, having a degree of crystallinity in a range of about 10% to about 100%.

5. The thermoelectric material of claim 1, wherein x is equal to or greater than 0 and equal to or less than 0.5.

6. The thermoelectric material of claim 1, wherein y is equal to or greater than 0 and equal to or less than 0.5.

7. The thermoelectric material of claim 1, having a thermal conductivity of about 0.8 W/mK to about 1.1 W/mK at room temperature.

8. The thermoelectric material of claim 7, having a degree of crystallinity of about 20% or about 95%.

9. The thermoelectric material of claim 1, wherein C in the formula is F, Cl, Br, or I.

10. A thermoelectric module, comprising:
a first electrode;
a second electrode; and
a thermoelectric element disposed between the first electrode and the second electrode; wherein the thermoelectric element comprises a thermoelectric material represented by the following formula:

$$In_{4-x}Se_{3-y-z}C_z$$

wherein C is at least one selected from halogen elements,
wherein x is between −1 and 1, wherein y is between −1 and 1,
wherein z is about 0.03, and
wherein the thermoelectric material has a thermal conductivity of about 1.1 W/mK or less at room temperature, and wherein the thermoelectric material has a one-dimensional or two-dimensional lattice distortion in an in-plane direction and a disordered layered structure in an a-axis direction that is perpendicular to the in-plane direction.

11. A thermoelectric device comprising:
a heat source; and
a thermoelectric module comprising:
a thermoelectric element that absorbs heat from the heat source;
a first electrode disposed to be in contact with the thermoelectric element; and
a second electrode disposed to face the first electrode and be in contact with the thermoelectric element,
wherein the thermoelectric element comprises a thermoelectric material represented by the following formula:

$$In_{4-x}Se_{3-y-z}C_z$$

wherein C is at least one selected from halogen elements,
wherein x is between −1 and 1, wherein y is between −1 and 1,
wherein z is about 0.03, and
wherein the thermoelectric material has a thermal conductivity of about 1.1 W/mK or less at room temperature, and wherein the thermoelectric material has a one-dimensional or two-dimensional lattice distortion in an in-plane direction and a disordered layered structure in an a-axis direction that is perpendicular to the in-plane direction.

12. The thermoelectric device of claim 11, further comprising an insulating substrate on which one of the first electrode and the second electrode is disposed.

13. The thermoelectric device of claim 11, wherein one of the first electrode and the second electrode is configured to be exposed to a heat source.

14. The thermoelectric device of claim 11, wherein one of the first electrode and the second electrode is coupled to a power source.

15. An apparatus, comprising:
a heat source; and
a thermoelectric device including:
a first electrode which absorbs heat from the heat source;
a second electrode disposed substantially opposite the first electrode; and
a thermoelectric material represented by the following formula:

$$In_{4-x}Se_{3-y-z}C_z$$

wherein C is at least one selected from halogen elements,
wherein x is between −1 and 1, wherein y is between −1 and 1,
wherein z is about 0.03, and
wherein the thermoelectric material has a thermal conductivity of about 1.1 W/mK or less at room temperature, and wherein the thermoelectric material has a one-dimensional or two-dimensional lattice distortion in an in-plane direction and a disordered layered structure in an a-axis direction that is perpendicular to the in-plane direction.

16. A chalcogenide compound represented by the following formula:

$$In_{4-x}Se_{3-y-z}C_z$$

wherein C is at least one selected from halogen elements, wherein x is between −1 and 1, wherein y is between −1 and 1,
wherein z is about 0.03, and
wherein the thermoelectric material has a thermal conductivity of about 1.1 W/mK or
wherein the chalcogenide compound has a thermal conductivity of about 1.1 W/mK or less at room temperature, and wherein the chalcogenide compound has a one-dimensional or two-dimensional lattice distortion in an in-plane direction and a disordered layered structure in an a-axis direction that is perpendicular to the in-plane direction.

* * * * *